(12) United States Patent
McNally et al.

(10) Patent No.: US 11,402,409 B1
(45) Date of Patent: Aug. 2, 2022

(54) DIFFERENTIAL CURRENT SENSOR PACKAGE

(71) Applicant: Allegro MicroSystems, LLC, Manchester, NH (US)

(72) Inventors: Maxwell McNally, Manchester, NH (US); Kevin Buckley, Hollis, NH (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 19 days.

(21) Appl. No.: 17/208,093

(22) Filed: Mar. 22, 2021

(51) Int. Cl.
*G01R 15/20* (2006.01)
*G01R 31/28* (2006.01)
*G01R 31/52* (2020.01)

(52) U.S. Cl.
CPC ......... *G01R 15/202* (2013.01); *G01R 15/205* (2013.01); *G01R 31/2896* (2013.01); *G01R 31/52* (2020.01)

(58) Field of Classification Search
CPC .............. G01R 15/202; G01R 15/205; G01R 31/2896; G01R 31/52
USPC .................................... 324/76.11, 200, 207.2
See application file for complete search history.

(56) References Cited

U.S. PATENT DOCUMENTS

| | | | |
|---|---|---|---|
| 6,356,068 B1 | 3/2002 | Steiner et al. | |
| 6,424,018 B1 | 7/2002 | Ohtsuka | |
| 6,462,531 B1 | 10/2002 | Ohtsuka | |
| 6,545,457 B2 | 4/2003 | Goto et al. | |
| 6,683,448 B1 | 1/2004 | Ohtsuka | |
| 6,727,683 B2 | 4/2004 | Goto et al. | |
| 6,759,841 B2 | 7/2004 | Goto et al. | |
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,921,955 B2 | 7/2005 | Goto | |
| 7,598,601 B2 | 10/2009 | Taylor et al. | |
| 7,816,905 B2 | 10/2010 | Doogue et al. | |
| 8,080,994 B2 | 12/2011 | Taylor et al. | |
| 8,604,777 B2 | 12/2013 | Doogue et al. | |
| 8,896,295 B2 | 11/2014 | Friedrich et al. | |

(Continued)

FOREIGN PATENT DOCUMENTS

| | | |
|---|---|---|
| JP | 2000174357 A | 6/2000 |
| JP | 2001221815 A | 8/2001 |

(Continued)

OTHER PUBLICATIONS

U.S. Non-Final Office Action dated Jan. 12, 2022 for U.S. Appl. No. 17/083,487; 12 Pages.

(Continued)

*Primary Examiner* — Giovanni Astacio-Oquendo
(74) *Attorney, Agent, or Firm* — Daly Crowley Mofford & Durkee, LLP (57) ABSTRACT

Methods and apparatus for measuring a current difference between at least two primary current paths in a current sensor integrated circuit package. Each primary current path generated a magnetic field which may then be measured by at least one magnetic field sensing element positioned on an integrated circuit die. An output disconnect signal may be provided from the current sensor integrated circuit package when a current difference above a predetermined threshold exists in the two or more current traces.

29 Claims, 6 Drawing Sheets

(56) References Cited

U.S. PATENT DOCUMENTS

| | | |
|---|---|---|
| 8,907,437 B2 | 12/2014 | Milano et al. |
| 9,007,054 B2 | 4/2015 | Friedrich et al. |
| 9,081,041 B2 | 7/2015 | Friedrich et al. |
| 9,190,606 B2 | 11/2015 | Liu et al. |
| 9,214,884 B2 | 12/2015 | Sonoda et al. |
| 9,865,807 B2 | 1/2018 | Liu et al. |
| 10,345,343 B2 | 7/2019 | Milano et al. |
| 10,520,559 B2 | 12/2019 | Cesaretti et al. |
| 10,725,100 B2 * | 7/2020 | Milano .............. G01R 33/0017 |
| 10,753,963 B2 | 8/2020 | Milano et al. |
| 10,955,306 B2 | 3/2021 | Cadugan et al. |
| 2004/0080308 A1 | 4/2004 | Goto |
| 2006/0219436 A1 | 10/2006 | Taylor et al. |
| 2010/0156394 A1 | 6/2010 | Ausserlechner et al. |
| 2011/0234215 A1 | 9/2011 | Ausserlechner |
| 2014/0266180 A1 | 9/2014 | Ausserlechner |
| 2018/0238711 A1 | 8/2018 | Zimmer |
| 2018/0321282 A1 | 11/2018 | Hurwitz |
| 2019/0362619 A1 * | 11/2019 | Petrie ....................... G01D 3/08 |
| 2020/0132728 A1 | 4/2020 | Boury et al. |
| 2020/0313637 A1 * | 10/2020 | Daubert .................. G05F 1/625 |
| 2021/0033424 A1 | 2/2021 | Cadugan |
| 2021/0223292 A1 | 7/2021 | Liu et al. |
| 2021/0311136 A1 | 10/2021 | Augendre et al. |

FOREIGN PATENT DOCUMENTS

| | | |
|---|---|---|
| JP | 2001339109 A | 12/2001 |
| JP | 2002040058 A | 2/2002 |
| JP | 2002202326 A | 7/2002 |
| JP | 2002202327 A | 7/2002 |

OTHER PUBLICATIONS

Response to U.S. Non-Final Office Action dated Jan. 12, 2022 for U.S. Appl. No. 17/083,487; Response filed on Jan. 19, 2022; 8 Pages.

U.S. Notice of Allowance dated Feb. 18, 2022 for U.S. Appl. No. 17/083,487; 12 Pages.

U.S. Appl. No. 17/083,487, filed Oct. 29, 2020, Briano, et al.

* cited by examiner

DIFFERENTIAL CURRENT SENSOR PACKAGE

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

Some current sensors, such as a ground fault interrupt (GFI) current sensor, are configured to look for small differences in current, typically less than 0.01% of full scale or less than 25 mA, between two conductors. Having a current sensor which can effectively determine when a current difference exists between two conductors can be challenging.

SUMMARY

Example embodiments of the disclosure provide methods and apparatus for sensing a current between two or more primary current conductors in a current sensor integrated circuit package. In embodiments, as current in a first primary current path generates a first magnetic field, and a second primary current path generates a second magnetic field, the difference of the first and second magnetic fields is compared to a threshold for providing an output to indicate that a difference between the first and second currents is above a predetermined level.

In embodiments, a current sensor integrated circuit (IC) in an IC sensor package may contain one or more magnetic field sensing elements, which may comprise a planar Hall element, a vertical Hall element, and/or a magnetoresistance element, such as a giant magnetoresistance element (GMR), a tunneling magnetoresistance element (TMR) or a magnetic tunnel junction (MTJ), or a combination of magnetic field sensing elements. In an embodiment that uses more than one magnetic field sensing element, at least two magnetic field sensing elements may have an axis of maximum sensitivity configured in the order of about 180 degrees from each other.

A current sensor integrated circuit in the IC sensor package may contain a current calculation circuit on the integrated current sensor die to calculate the current flowing in the first and second primary conductors, as the measured value of the magnetic field combination from the primary conductors, or positioned so that the current in each primary conductor is measured independently. In embodiments, a disconnect output signal may be generated by the current calculation circuit and provided as an output of the current sensor integrated circuit. In embodiments, the output disconnect signal may be activated by a current difference between the first and second primary conductors of approximately 10%, 20%, or more. In embodiments, a minimum disconnect trigger level detection circuit may be included.

A current sensor integrated circuit IC sensor package may contain an integrated circuit die with an output protocol circuit to output in SPIE, SENT, or I²C protocols.

A method may use one or more magnetic field sensing elements to measure the current in conductive traces. The magnetic field sensing elements may comprise a planar Hall element, a vertical Hall element, or a magnetoresistance element, such as a giant magnetoresistance element (GMR), a tunneling magnetoresistance element (TMR) or magnetic tunnel junction (MTJ), and/or a combination of magnetic field sensing elements. In an embodiment that uses more than one magnetic field sensing element, at least two magnetic field sensing elements may have an axis of maximum sensitivity configured 180 degrees from each other.

The method to provide a output disconnect signal from the current sensor or differential Hall sensor integrated circuit may contain a current calculation circuit on the integrated current sensor die to calculate the current flowing in the conductive traces or wires as the measured value of the magnetic field combination from the two wires, or positioned so that the current in each wire is measured independently. In embodiments, a disconnect output signal may be generated by the current calculation circuit and provided as an output of the current sensor integrated circuit package. The method may provide an output disconnect signal activated by a current difference between the two conductors of approximately 10%, 20%, or more. The method may include a minimum disconnect trigger level detection circuit. The method may be used to detect a ground or reference voltage disconnect in a motor.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but will be readily understood by one of ordinary skill in the art.

In particular, it should be understood that a so-called comparator can comprise an analog comparator having a two state output signal indicative of an input signal being above or below a threshold level (or indicative of one input signal being above or below another input signal). However, the comparator can also comprise a digital circuit having an output signal with at least two states indicative of an input signal being above or below a threshold level (or indicative of one input signal being above or below another input signal), respectively, or a digital value above or below a digital threshold value (or another digital value), respectively.

Figure 1:
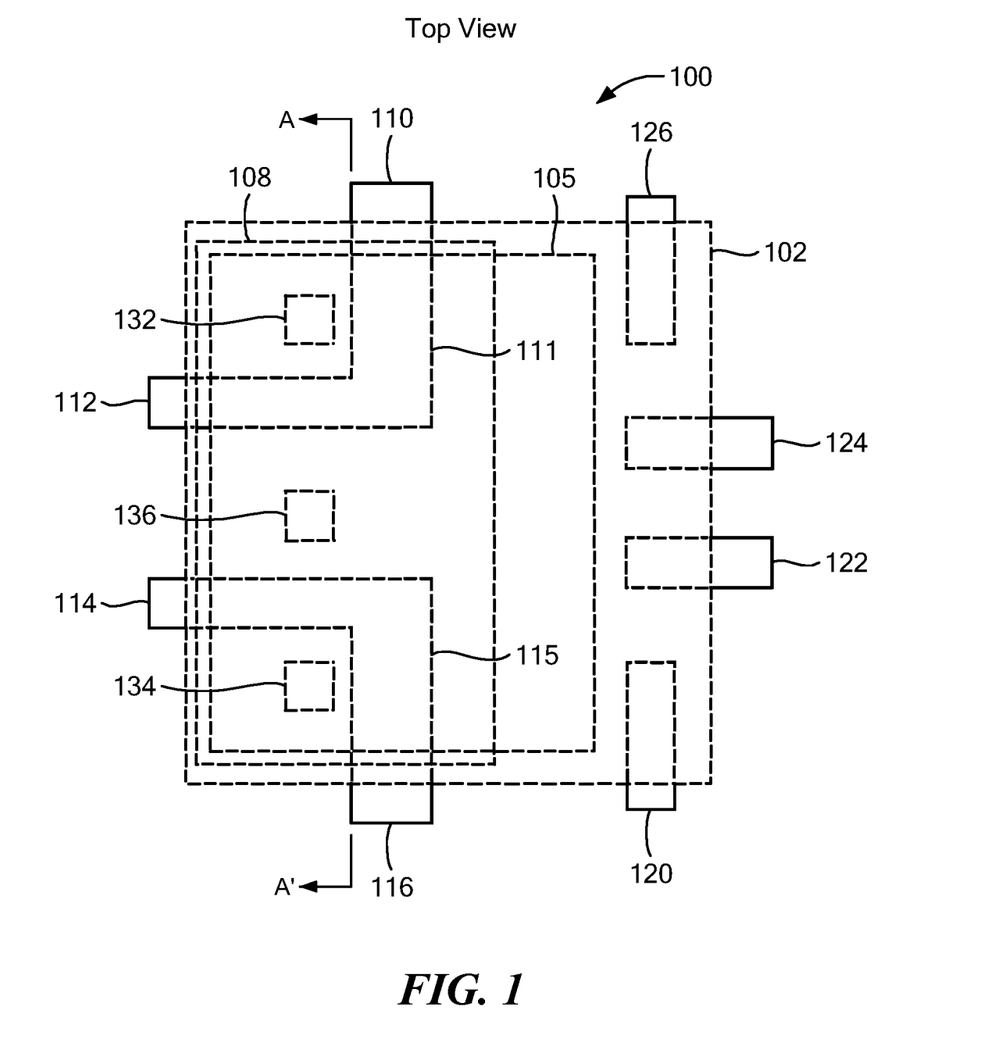
FIG. 1 shows a top view of a current sensor integrated circuit package.

FIG. 1 shows a current sensor integrated circuit package 100 top view. A current sensor integrated circuit package body 102 contains an integrated current sensor die 105. Current lead 110 connected to current lead 112 forms a first primary current path 111. Current lead 114 connected to current lead 116 forms a second primary current path 115. Signal leads 120, 122, 124, and 126 provide power, ground, input, and output, or other required connections for the IC package. Magnetic field sensing elements 132, 134, and 136 are supported by or disposed within the integrated circuit die 105 and positioned in proximity to the first and second primary conductor paths 111, 115. An optional insulator layer 108 is shown between the primary current paths 111, 115 and integrated circuit die 105. The insulator may include, but is not limited to, a polyimide film on the back of the die, a piece of insulating tape, for example Kapton® tape, and/or another insulator coating applied to the die 105 or applied to the primary current conductors 111, 115.

The integrated circuit die 105 is attached to the leadframe, or leads, of the package. The die may be attached using, for example, chip on lead, lead on chip, or flip-chip arrangements.

An alternate embodiment may contain a different number of signal leads, or current leads. For example a package may contain four current leads that form two primary current paths, and have 2 or more signal leads, which may be used to communicate and power the integrated circuit die in the current sensor integrated circuit package of FIG. 1. In some cases the number of signal leads may be 2-16 leads.

Figure 1A:
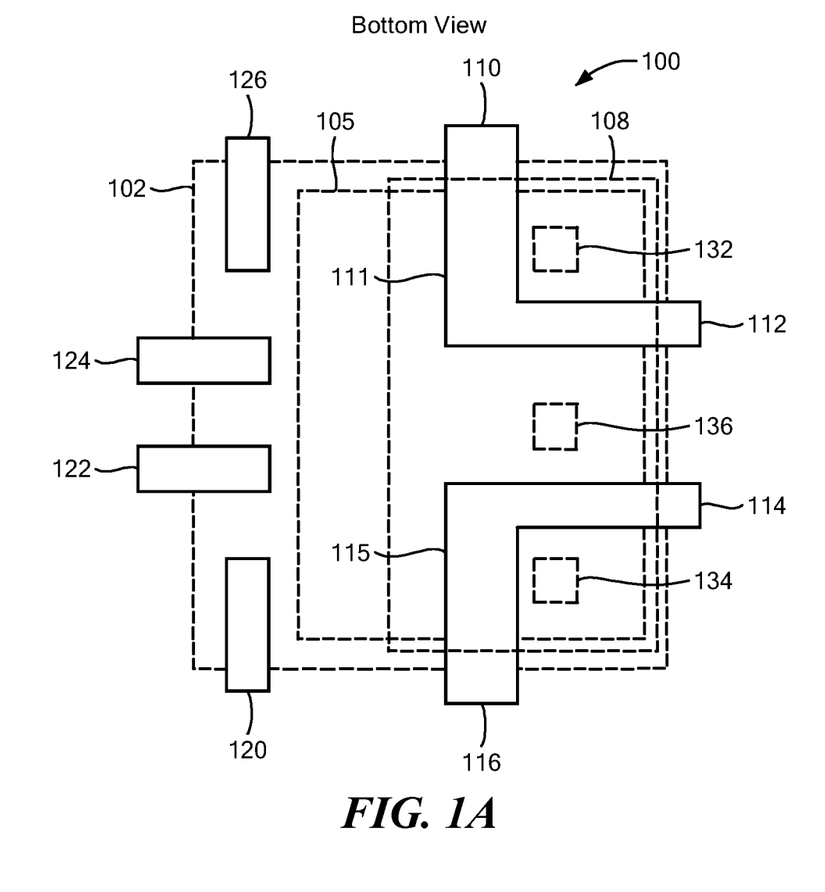
FIG. 1A shows a bottom view of a current sensor integrated circuit package.

FIG. 1A shows a bottom view of current sensor integrated package 100 of FIG. 1. Signal leads 120, 122, 124, 126, current leads 110, 112, 114, 116, and current paths 111, 115 are exposed on the bottom of the package. The package body 102 encloses the current sensor integrated circuit 105 which supports or contains the magnetic field sensing elements 132, 134, 136. An optional insulator layer 108 is shown between the primary current paths 111, 115 and integrated circuit die 105.

Figure 1B:
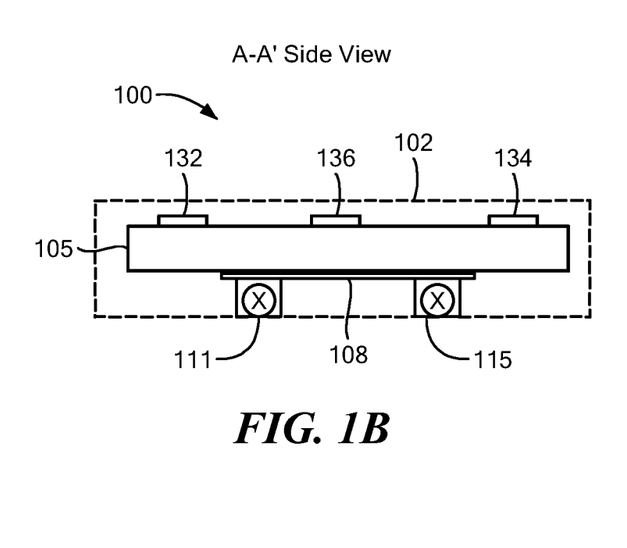
FIG. 1B shows a side view of a current sensor integrated circuit package along the line A-A' of FIG. 1.

FIG. 1B provides a side view of FIG. 1 along the line A-A' of the current sensor integrated circuit package 100. The package body 102 encloses the current sensor integrated circuit 105 which supports or contains the magnetic field sensing elements 132, 134, 136. Current paths 111, 115 are shown as exposed on the bottom of the package body 102. Insulator 108 is shown between the primary current paths 111, 115 and the current sensor integrated circuit die 105.

FIGS. 1-1B show the leads extending beyond the side of the package. In another embodiment the leads may be flush with the sides of the package. An embodiment may have the leads extend from the package and have bends in the leads to allow connection to a further assembly, including but not limited to a printed circuit board or PCB.

Figure 2:
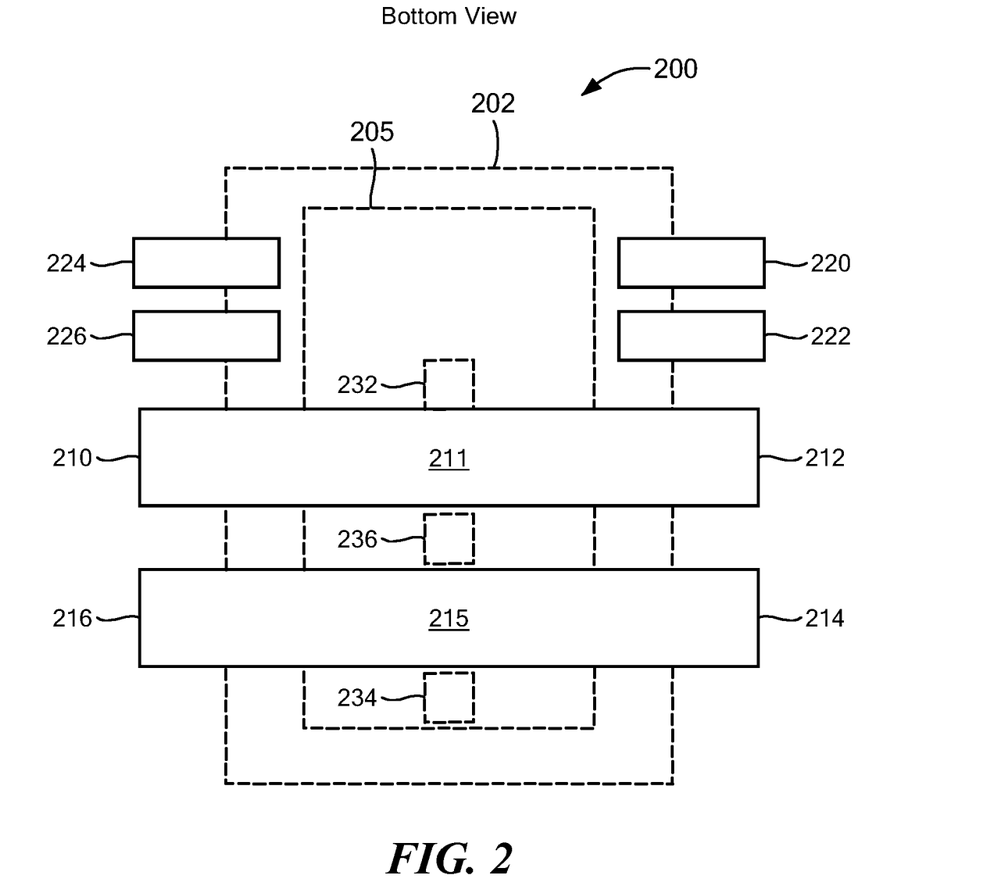
FIG. 2. is a bottom view of an alternative current sensor integrated circuit package.

FIG. 2 provides an alternative arrangement of the leads of a current sensor integrated circuit package 200 having some commonality with the IC package of FIG. 1 where [state difference in FIG. 2]. Package body 202 encloses integrated circuit die 205, which supports or contains magnetic field sensing elements 232, 234, 236. Primary current leads 210, 212 are connected by first primary current path 211. Primary current leads 214, 216 are connected by second primary current path 215. Signals leads 220, 222 and current leads 212, 214 are provided on one side of the current sensor integrated package 200. Signal leads 224, 226 and current leads 210, 216 are provided on another side of current sensor integrated circuit package 200.

In one embodiment signals leads 220, 222 and current leads 212, 214 are on an opposite side of the package from signal leads 224, 226 and current leads 210, 216. In this type of embodiment the package is similar to a dual in line package. In one embodiment the leads may be formed as exposed leads.

In another embodiment there may be first and second magnetic field sensing elements, for example 132, 134 of FIG. 1 or 232, 234 of FIG. 2. Another embodiment may have magnetic field sensing elements 132, 136 of FIG. 1, or 232, 236 of FIG. 2. In other embodiments there may be more than two magnetic field sensing elements provided.

In operation a current is provided in primary current paths 111, 115 of FIG. 1, or 211, 215 of FIG. 2 and these currents produce a magnetic field which may be sensed by magnetic field sensing elements 132, 134, 136 of FIG. 1, or like elements 232, 234, 236 of FIG. 2. Integrated circuit die, e.g., 105 or 205, may contain circuit elements, including but not limited to, amplifiers, comparators, buffers, multiplexers, timing circuits, analog to digital convertors (ADCs), digital to analog convertors (DACs), gain control circuit, offset control circuit, output circuits, controllers, memory elements, and processor circuits, including but not limited to microprocessors. It should be noted that although many circuits are listed as plural, in use some embodiments may use a single circuit of a given type.

Figure 3:
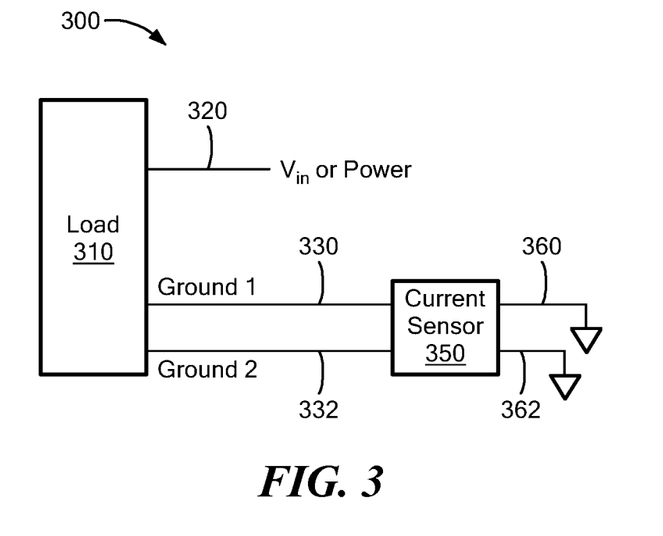
FIG. 3 is a schematic overview of a system for use with the current sensor integrated circuit package.

FIG. 3 shows a current sensing system 300 for sensing a current in a load 310 such as a motor, LED light, string of lights, or other electrical circuit for which it is desired to measure current. The load 310 has a voltage input Vin and/or power input 320. In embodiments, the load 310 has a first ground wire 330 for a first ground (ground 1) and a second ground wire 332 for a second ground (ground 2). In embodiments, ground 1 and/or ground 2 may comprise traces on a circuit board. A current sensor integrated circuit package 350 may be positioned near the first and second ground wires/conductors 330, 332 and has integrated current paths, such as 111, 115, of FIG. 1 or 211, 215 of FIG. 2. On the other side of the current sensor 350, the electrical conductors 330, 332 are connected to ground or other reference voltage potential through conductors, traces, or wires 360, 362. The current paths provided by the current sensor integrated circuit package 350 interrupt the ground lines as shown by 330, 360, and 332, 362.

In a motor application, including AC or DC motor applications, it may be desirable to know when there is a current mismatch between ground wires 330, 332. In some motor applications this mismatch may be above what may be observed in a typical ground fault interrupt circuit (GFI). As such, the use of a GFI current sensing system would indicate a problem where a problem may not exist in a motor application. For example, in some cases, the current may be 55% to 75% in one current path or ground wire and 25% to 45% in the other current path or ground wire. For example, in some cases the current in ground wires may be split up to 70% in one and 30% in another current path and this would not be a reason for a flag or problem indicator. In another case the current may be acceptable at between 40-60% in each ground wire or current path. These current differences may be greater than 100 mA or larger, for example, a current difference may be greater than 1 A or 2 A in certain applications. A conventional GFI type of current sensor would typically trip at a difference current of 25 mA (out of a 15 A rated current or below 0.2% of the rated range) between two conductors. IN a motor application or other applications where there may be noise between two ground lines or power lines as described above the typical GFI trip point would result in the current difference causing a fault when a fault does not exist in the application, again where the application can tolerate, for example a 10% or 20% or greater difference in currents between the two primary conductors.

In an embodiment the current sensor integrated circuit package 350 with primary current paths, for example first primary current path 111 or 211 and second primary current path 115 or 215 of FIG. 1, or 211, 215 of FIG. 2 may be configured in parallel with the current flow in a conductor, e.g. a wire, or a trace on a PC board, from 330 to 360, and the current flow from 332, 362. In such an embodiment the current in the conductors to be measured may be larger than those capable of being carried by the current sensor integrated package, as not all of the current to be measured would flow through the current sensor integrated package 350.

In another embodiment, other currents may be measured. For example, one primary current path may measure $V_{CC}$, 320, and another primary current path may measure a ground current, for example ground 1, 330 of FIG. 3.

Another embodiment may have the two primary current paths connected in parallel, for example to form two lines connecting VCC 320 to a load 310 in FIG. 3 similar to what is shown for the ground connection in FIG. 3.

Another embodiment may have one primary current path of the current sensor integrated circuit package connected to a first voltage source, e.g. VCC, and another primary current path of the current sensor integrated circuit package connected to a second voltage source. The second voltage source may be at the same voltage as the first voltage source, e.g. VCC to form a redundant voltage supply path to the load.

In another embodiment there may be more than two primary current paths in the integrated current sensor package 350. For example, three primary current paths may be available to measure the current in the VCC pin 320, and in both ground 1, 330, and ground 2, 332.

Figure 4:
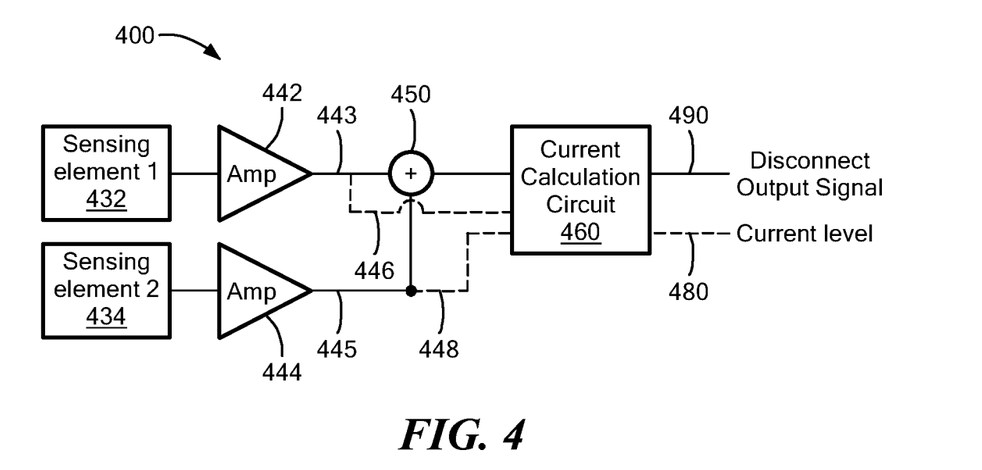
FIG. 4 is a schematic overview of an integrated circuit in a current sensor integrated circuit package.

FIG. 4 provides an example of a current mismatch circuit 400 that may form part of a current sensor integrated circuit. In example embodiments, current mismatch circuit 400 includes first and second magnetic field sensing elements 432, 434. In an embodiment, the first magnetic field sensing element 432 and the second magnetic field sensing element 434, may comprise planar Hall plates. The magnetic field sensing elements 432, 434, are connected to first and second amplifiers 442, 444 respectively. The output of the amplifiers 443, 445 may be summed in a summing element 450. The sum of the two magnetic field sensing elements 432, 434 is input to a current calculation circuit 460, which may include a comparator to compare a difference (or sum) of the measured magnetic fields detected by magnetic field sensing elements 432, 434. The threshold of the comparator in the current calculation circuit 460 may be programmable, such as by the manufacturer or customer. The current calculation circuit 460 provides a disconnect output signal 490, or fault signal, that may go to a pin or lead on the current sensor IC.

In another embodiment, the output of the current calculation circuit 460 may be provided to an output circuit as part of the current sensor IC circuit. An output circuit in the current sensor IC circuit may allow output in the form of a SENT, I²C, or other output format including changing the outputs on pins at a defined clock frequency.

FIG. 4 also shows an alternative set of connections 446, 448, 480 in dotted lines. The magnetic field level from the first sensing element 432, may be provided to the current calculation circuit 460. The magnetic field level from the second sensing element 434 may be provided to the current calculation circuit 460. The signals on the traces 446, 448 may be used to calculate the current in each line to be sensed, for example 330, 332 on FIG. 3, which may be first and second primary current paths 111, 115 in FIG. 1. The current calculation may be output on for example on pins, lines, or traces 480. In other embodiments, the first and second primary current paths 111, 115 in FIG. 1 and the sum of the two currents may be output. In some embodiments the output or trace 480 may be expanded into three output pins, lines, or traces, so the current in each of the two primary current paths 111, 115 of FIG. 1 to be measured can be output, as well as the sum of the current in the two current paths 111, 115. Other outputs such as a disconnect output signal may also be present on additional output pins or leads. Multiple outputs may be combined on one pin, or lead as described above with the use of an output protocol.

In another embodiment the direction of the current in a conductor, or the position of the conductor may result in a sum of the two Hall plates 432, 434 becoming a difference, for example if the two primary current paths 111, 115 have current flowing in the same direction. In such a case it may be desirable to change the polarity, or the positive output voltage orientation, of one of the Hall plates or magnetic field sensing elements. In such a case one Hall plate would provide a positive Hall voltage, for example Hall plate 432, for a magnetic field out of the plane of the integrated circuit die, and Hall plate 434 would provide a negative Hall voltage for a magnetic field out of the plane of the integrated circuit die.

Figure 5:
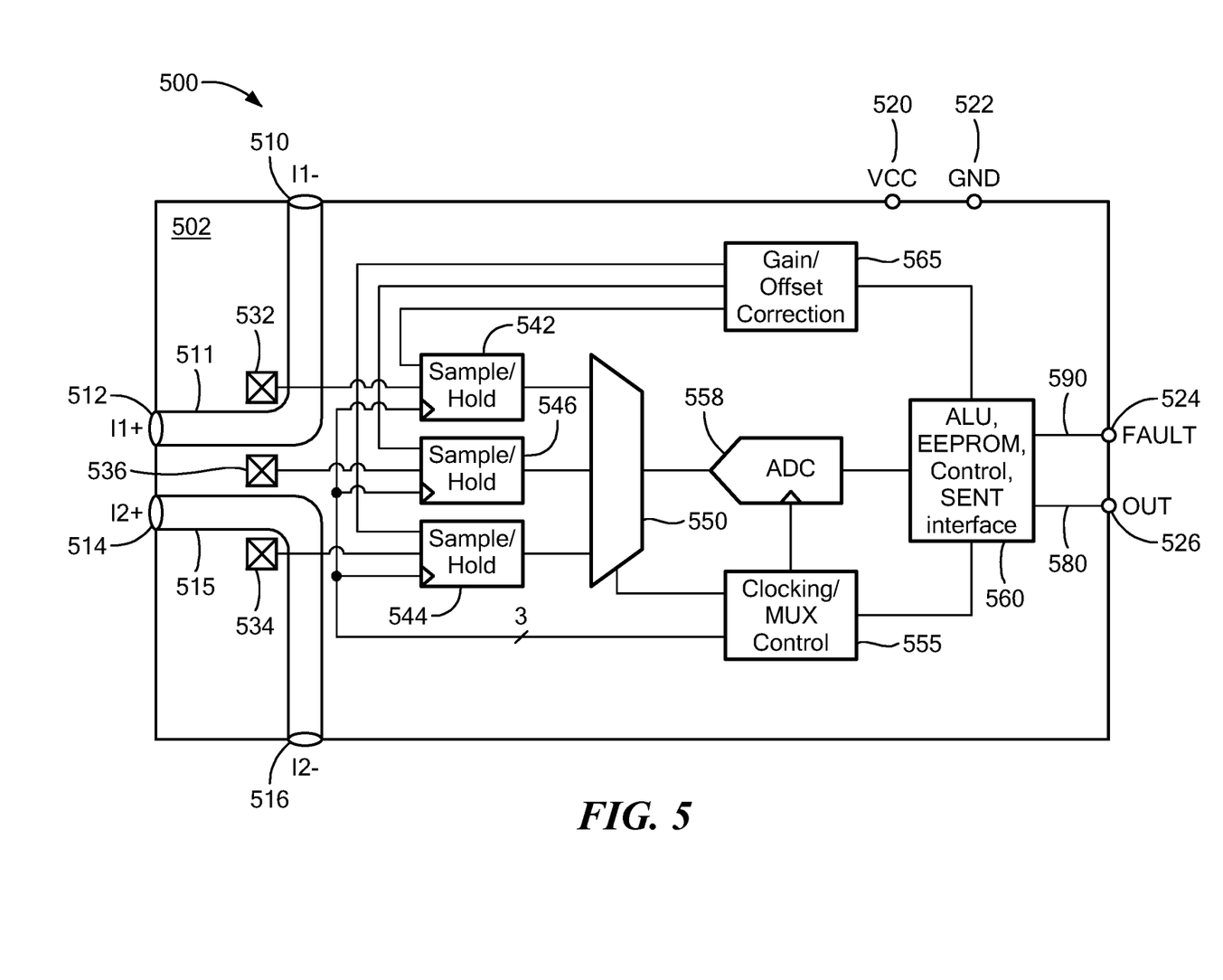
FIG. 5 is an alternative schematic overview of an integrated circuit in a current sensor integrated circuit package.

FIG. 5 shows a current sensor integrated circuit package 500 with an integrated circuit die 505 in package body 502. Current leads 510, 512 are connected by first current path 511. Current leads 514, 516 are connected by second current path 515. Small signal lead, meaning the leads not connected to the primary current to be measured, 520 is shown as a $V_{CC}$, or voltage supply pin, small signal lead 522 is shown as a ground, or reference voltage lead, small signal lead 524 is a fault output, and small signal lead 526 is an output lead. In an embodiment small signal output lead 526, also referred to as OUT, may be the current level lead or signal described in FIG. 4 as current level 480.

Integrated circuit die 505 supports or contains magnetic field sensing elements 532, 534, 536 which are connected to sample and hold circuits 542, 544, 546. Magnetic field sensing element 532 is connected to sample and hold circuit 542, magnetic field sensing element 534 is connected to sample and hold circuit 544, and magnetic field sensing element 536 is connected to sample and hold circuit 546. The output of the sample and hold circuits 542, 544, 546 are connected to a multiplexer circuit 550. A clocking or mux control 555, is connected to the multiplexer circuit 550, and sample and hold circuit 542, 544, 546. The multiplexer circuit 550 connected to an analog to digital converter (ADC) circuit 558 which connects to a control circuit 560. Control circuit 560 may contain an Arithmetic Logic Unit (ALU), EEPROM, or other memory elements such as FLASH memory, a controller, and an output protocol circuit, for example but not limited to SENT, SPIE, I²C or other output codes. The control circuit 560 has a fault signal 590 that connects to fault lead 524, a current output signal 580 which connects to the out lead 526. The control circuit 560 is connected to the clocking/mux control circuit 555. The gain/offset correction circuit 565 is connect to the control circuit 560 and to each of the sample and hold circuits 542, 544, 546.

In operation a current is flowing through the primary current path 511, and current is flowing in primary current path 515. The currents generate a magnetic field which may be sensed by the three magnetic field sensors, 532, 534, 536. If the currents are in same direction and of the same magnitude, or current level, e.g. if both currents are 1 A or both are 10 A, then the magnetic field sensed at the magnetic field sensing element 536 will be near zero. If the currents are flowing in opposite directions through the primary current paths then the magnetic field sensed at the magnetic field sensing element 536 will be approximately two times the current in each primary current path. These can be calibrated using a known current and trimmed during current sensor integrated circuit package manufacturing (including a final test step), or later once the current sensor integrated package has been placed into a system or board assembly. Other math between the various magnetic field sensing elements 532, 534, 536 may be performed to determine the current in each primary current path 511, 515 of the current sensor integrated circuit package. In embodiments, the current flowing in primary current path 511 may provide a stronger magnetic field to magnetic field sensing element 532 than the current flowing in the primary current path 515. Likewise, the current flowing in primary current path 515 may provide a stronger magnetic field to magnetic field sensing element 534 than the current flowing in the primary current path 511. This can allow the individual current in each primary current path 511, 515 to be determined.

In an embodiment magnetic field sensing element 536 provides a magnetic field signal to the sample and hold circuit 546 which can be used to calculate a fault level signal by the processor 560. If the fault signal is above a certain threshold, meaning if the current in primary current paths 511, 515, are different by a defined amount the processor 560 can output a fault signal 590 to a fault lead 524. In an embodiment, a fault signal, or in some cases a disconnect output signal, will be generated if a current difference greater than 10% exists between the first primary current path 511, and the second primary current path 515. In another embodiment a fault signal, or in some cases it may be a disconnect output signal will be generated if a current difference greater than 20% exists between the first primary current path 511, and the second primary current path 515.

In another embodiment a minimum current check may be performed to determine if a current level of the current flowing in a primary current is above the noise level of the integrated circuit current sensor. For example if the current detected in primary current paths 511 or 515 of the current sensor integrated circuit package is rated for a minimum detectable current level due to the noise in a package or other features of the current sensor integrated circuit package with the current sensor IC then current level differences measured may not need to trigger an output disconnect signal. In such a case a minimum disconnect trigger level may be set that would not allow an output disconnect signal to be triggered. This could be an AND type circuit where an output disconnect signal and a minimum disconnect trigger signal must both be high for the output disconnect signal to be communicated or indicated from the package. For example if the current sensor IC in the current sensor integrated circuit package has a minimum resolution of 250 mA and a 10%, 20%, or other set difference between the first and second primary conductors would only be 200 mA then a fault signal, or output disconnect signal, would not be triggered.

A comparison circuit, such as a comparator, or a digital logic circuit, may be used to compare the measured current level in a primary current path to a threshold, which may represent a minimum current resolution, or some other minimum current level to be reached before an output disconnect signal is triggered. Such an embodiment is useful for example when the load of the current being measured is noisy. Another example is when a low current level in the two primary conductor paths would not pose a risk of causing a fuse like action in a primary current path or elsewhere in the system connected to the current sensor integrated circuit package if all of the current were flowing in only one of the two primary current paths and it is not desired to receive an output disconnect signal or fault. The minimum disconnect level could be programmable during integrated circuit manufacturing, or after the integrated circuit package in mounted on a board or place into a system with a load to be measured.

As a near zero magnetic field may require the magnetic field sensing elements to be precisely aligned to the primary current paths 511, 515, for example if magnetic field sensing elements were an equal distance from both primary current paths 511, 515, in an embodiment an additional calibration or correction circuit may be used to improve the performance of the magnetic field sensing elements 532, 534, 536. It is possible to calibrate the effect of the physical spacing in the current sensor integrated circuit package, for example 100, 200 of FIG. 1 or FIG. 2, during a final test or current sensor package is installed in a larger system such as a PC board, or other system. If the two primary currents flow in the same direction in primary current paths 511, 515, for example into leads 512, 514 and out of leads 510, 516 then the magnetic field sensing element 536 would see zero magnetic field, or near zero magnetic field. If a known current is applied to the primary current paths the individual magnetic field sensing elements may be calibrated. If, for example, for the same current level and there is a non zero magnetic field signal from the magnetic field sensing element 536, this can be set to zero by the processor 560, or another circuit such as the gain/offset correction circuit 565 to improve device performance by reducing error. A similar calibration test may be used on the other magnetic field sensing elements 532, 534 by applying a known current to the first and/or second primary current paths in a known combination.

In an embodiment if the primary current direction in the primary current paths 511, 515 are different, for example in primary current path 511 current enters current pin 510 and exits from current pin 512 and in primary current path 515 current enters from pin 514 and exits from pin 516 then the magnetic field seen by magnetic field sensing element 536 would be non-zero. For the same current level in each primary current path 511, 515 when the current is flowing in opposite directions the magnetic field at magnetic field sensing element 536 would be about or equal to the sum of the current in primary current paths 511, 515. Thresholds and fault levels in the circuit may be adjusted to detect when the magnetic field measured represents a mismatch in the two primary current paths and a fault output signal should be generated.

Alternative numbers of small signal leads may be provided. For example, a lead or leads may be provided for timing and data transfer to an external controller. In such an embodiment the current levels senses by the magnetic field sensing elements may be provided to an output as one lead per magnetic field sensing element, so for example in FIG. 5 three magnetic field sensor or current output leads, or multiple magnetic field sensing element outputs, or current levels may be provided on one pin in a formatted or known data sequence. In other embodiments a trigger lead to the current sensor integrated circuit package may allow for an external request to trigger the data output of individual or a combination of current levels, or magnetic field sensing element signals. In another embodiment the current levels provided may be a combination of two or more magnetic field sensing element measurements after processing by the integrated circuit die.

Figure 6:
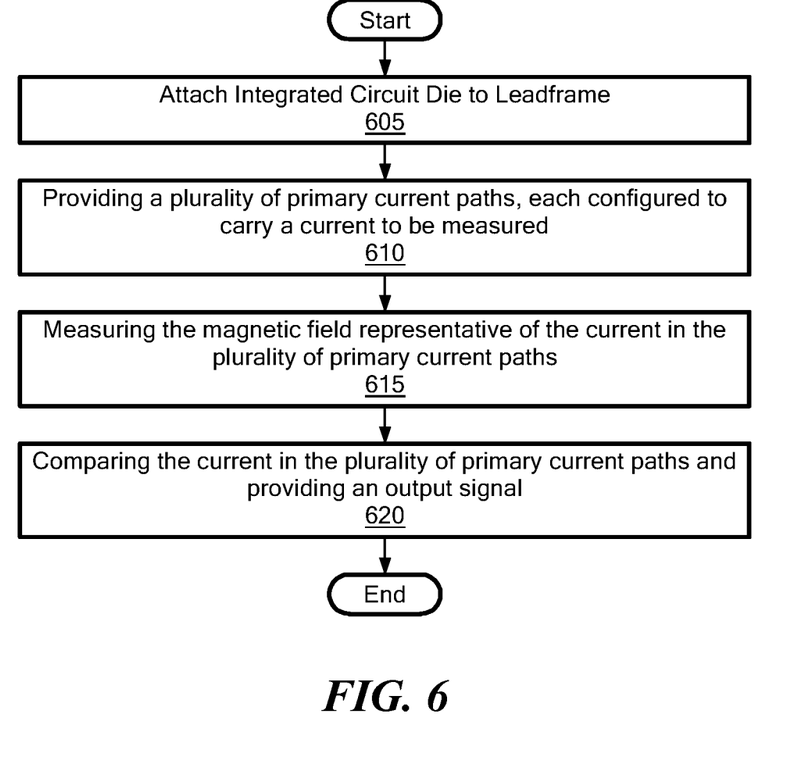
FIG. 6 is a flow diagram of a method for determining a current difference between primary current paths in a current sensor integrated circuit package.

Referring to FIG. 6, a method for determining a current difference between a plurality of current paths in the current sensor integrated circuit package (e.g., current sensor package 100, 500) begins at block 605 by providing a current sensor (e.g., current sensor 100, current sensor integrated circuit 505). At block 610, plurality of conductors (e.g., 111, 115) are provided, each of the conductors carrying a current to be measured.

At block 615, the magnetic field generated by the current in the plurality of conductors (e.g., 111, 115) is measured. Block 620 compares the current measurement in the plurality of conductors and provides a disconnect output signal.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensor integrated circuit package comprising:
    a package body;
    an integrated circuit die contained within the package body;
    a first magnetic field sensing element on the integrated circuit die;
    first and second signal leads externally accessible at the package body;
    first and second primary current paths externally accessible at the package body; and
    a current calculation circuit disposed on the current sensor integrated circuit die to compare current flowing in the first primary current path and the second primary current path.

2. The current sensor integrated circuit package of claim 1 wherein the first primary current path is positioned in proximity to the integrated circuit die, and the second primary current path is positioned in proximity to the integrated circuit die and the first primary current path.

3. The current sensor integrated circuit package of claim 1 further comprising an insulating layer between said integrated circuit die and said first and second primary current paths.

4. The current sensor integrated circuit package of claim 3, wherein the current sensor integrated circuit die includes a third magnetic field sensing element.

5. The current sensor integrated circuit package of claim 4 wherein the second magnetic field sensing element comprises one of a Hall Effect element or a magnetoresistance element.

6. The current sensor integrated circuit package of claim 5 wherein the Hall Effect element comprises a planar Hall Effect element or a vertical Hall Effect element.

7. The current sensor integrated circuit package of claim 5 wherein the magnetoresistance element comprises a semiconductor magnetoresistance element, an anisotropic magnetoresistance element (AMR), a giant magnetoresistance element (gmr), and/or a tunneling magnetoresistance element (TMR).

8. The current sensor integrated circuit package of claim 1, wherein the current sensor integrated circuit die further includes a second magnetic sensing element.

9. The current sensor integrated circuit package of claim 8 wherein the first and second magnetic field sensing elements have respective sensitivity response axes arranged approximately 180 degrees from each other.

10. The current sensor integrated circuit package of claim 1 wherein the current calculation circuit is configured to generate a disconnect output signal of the current sensor integrated circuit package.

11. The current sensor integrated circuit package of claim 10 wherein the current calculation circuit is further configured to generate a disconnect output signal if a minimum disconnect trigger level is above a threshold.

12. The current sensor integrated circuit package of claim 10 wherein the disconnect output signal is configured to be active when the respective currents in said first primary current path and said second primary current path are different by at least 10%.

13. The current sensor integrated circuit package of claim 10 wherein the disconnect output signal is configured to be active when the respective currents in said first primary current path and said second primary current path are different by at least 20%.

14. The current sensor integrated circuit package of claim 1 wherein the first magnetic field sensing element comprises a Hall Effect element or a magnetoresistance element.

15. The current sensor integrated circuit package of claim 14 wherein the Hall Effect element comprises a planar Hall Effect element or a vertical Hall Effect element.

16. The current sensor integrated circuit package of claim 14 wherein the magnetoresistance element is selected from the group consisting of a semiconductor magnetoresistance element, an anisotropic magnetoresistance element (AMR), a giant magnetoresistance element (gmr), and a tunneling magnetoresistance element (TMR).

17. The current sensor integrated circuit package of claim 1 wherein the integrated circuit die contains an output circuit capable of outputting at least one of a SENT, SPIE, or I$^2$C interface.

18. A method of sensing a current in current sensor integrated circuit package comprising:
    providing a first primary current path and a second primary current path in current sensor integrated circuit having a first magnetic field sensing element and an integrated circuit die in a current sensor integrated circuit package;
    measuring a magnetic field representative of a combination of a first current in the first primary current path and a second primary current path near the current sensor integrated circuit die;
    comparing current flowing in the first primary current path and the second primary current path, and;
    providing a disconnect output signal of the current sensor integrated circuit die based on the comparison of the currents in the first and second conductive traces.

19. The method according to claim 18 further comprising:
    providing a second magnetic sensing element in the current sensor integrated circuit die.

20. The method according to claim 19 wherein the first and second magnetic field sensing elements have respective sensitivity response axes arranged approximately 180 degrees from each other.

21. The method according to claim 19 further comprising a third magnetic field sensing element.

22. The method according to claim 18 further providing a minimum disconnect trigger level detection circuit.

23. The method of according to claim 18 wherein the disconnect output signal transitions when the current in the first primary current path and the second primary current path are different by at least 10%.

24. The method according to claim 18 wherein the disconnect output signal transitions when the currents in the first primary current path and the second primary current path are different by at least 20%.

25. The method according to claim 18 wherein the magnetic field sensing element comprises one of a Hall Effect element, or a magnetoresistance element.

26. The method according to claim 25, wherein the Hall Effect element is a planar Hall Effect element, or a vertical Hall Effect element.

27. The method according to claim 25 wherein the magnetoresistance element is selected from one of a semiconductor magnetoresistance element, an anisotropic magnetoresistance element (AMR), a giant magnetoresistance element (gmr), or a tunneling magnetoresistance element (TMR).

28. The method of claim 18, wherein the comparing current flowing in the first conductive trace and the second conductive trace comprises employing a current calculation circuit disposed on a die of the current sensor integrated circuit.

29. The method of claim 18 wherein the integrated circuit die contains an output circuit capable of outputting at least one of a SENT, SPIE, or I$^2$C interface.

* * * * *